(12) United States Patent
Esaki

(10) Patent No.: US 6,456,217 B1
(45) Date of Patent: Sep. 24, 2002

(54) DIGITAL/ANALOG CONVERTER HAVING DELTA-SIGMA TYPE PULSE MODULATION CIRCUIT

(75) Inventor: Takafumi Esaki, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/653,749

(22) Filed: Sep. 1, 2000

(30) Foreign Application Priority Data

Sep. 2, 1999 (JP) ............................................. 11-248169

(51) Int. Cl.[7] ............................. H03M 1/06; H03M 3/00
(52) U.S. Cl. ........................................ 341/143; 341/118
(58) Field of Search ................................ 341/143, 131, 341/139, 144, 150, 155, 118, 120; 318/807; 708/313

(56) References Cited

U.S. PATENT DOCUMENTS

| 4,901,077 A | * | 2/1990 | Christopher | ................ | 341/143 |
| 5,424,739 A | | 6/1995 | Norsworthy et al. | | |

FOREIGN PATENT DOCUMENTS

| JP | 7-212234 | 8/1995 |
| JP | 7-212236 | 8/1995 |
| JP | 8-213910 | 8/1996 |
| JP | 9-83368 | 3/1997 |

OTHER PUBLICATIONS

Shingaku Giho ICD95–123, dated Sep. 21, 1995, Technical Report of IEICE, The Institute of Electronics, Information and Communication Engineers.

* cited by examiner

*Primary Examiner*—Patrick Wamsley
(74) *Attorney, Agent, or Firm*—Hutchins, Wheeler & Dittmar

(57) ABSTRACT

In a digital/analog converter for (m+n)-bit, digital input data, a sigma-delta type pulse modulation circuit receives lower-order n bits of the digital input data to generate 1-bit data corresponding to the lower-order n bits in synchronization with a clock signal. An m-bit adder adds the 1-bit data to upper-order m bits of the digital input data. An m-bit digital/analog conversion section performs a digital-to-analog conversion upon an output value of the m-bit adder. A low-pass filter removes a high frequency component of an output value of the m-bit digital/analog conversion section to generate an analog data corresponding to the (m+n)-bit digital input data.

4 Claims, 13 Drawing Sheets

Fig. 2 PRIOR ART

| ON | $D_{in}$ | | |
|---|---|---|---|
| | D2 | D1 | D0 |
| SW0 | 0 | 0 | 0 |
| SW1 | 0 | 0 | 1 |
| SW2 | 0 | 1 | 0 |
| SW3 | 0 | 1 | 1 |
| SW4 | 1 | 0 | 0 |
| SW5 | 1 | 0 | 1 |
| SW6 | 1 | 1 | 0 |
| SW7 | 1 | 1 | 1 |

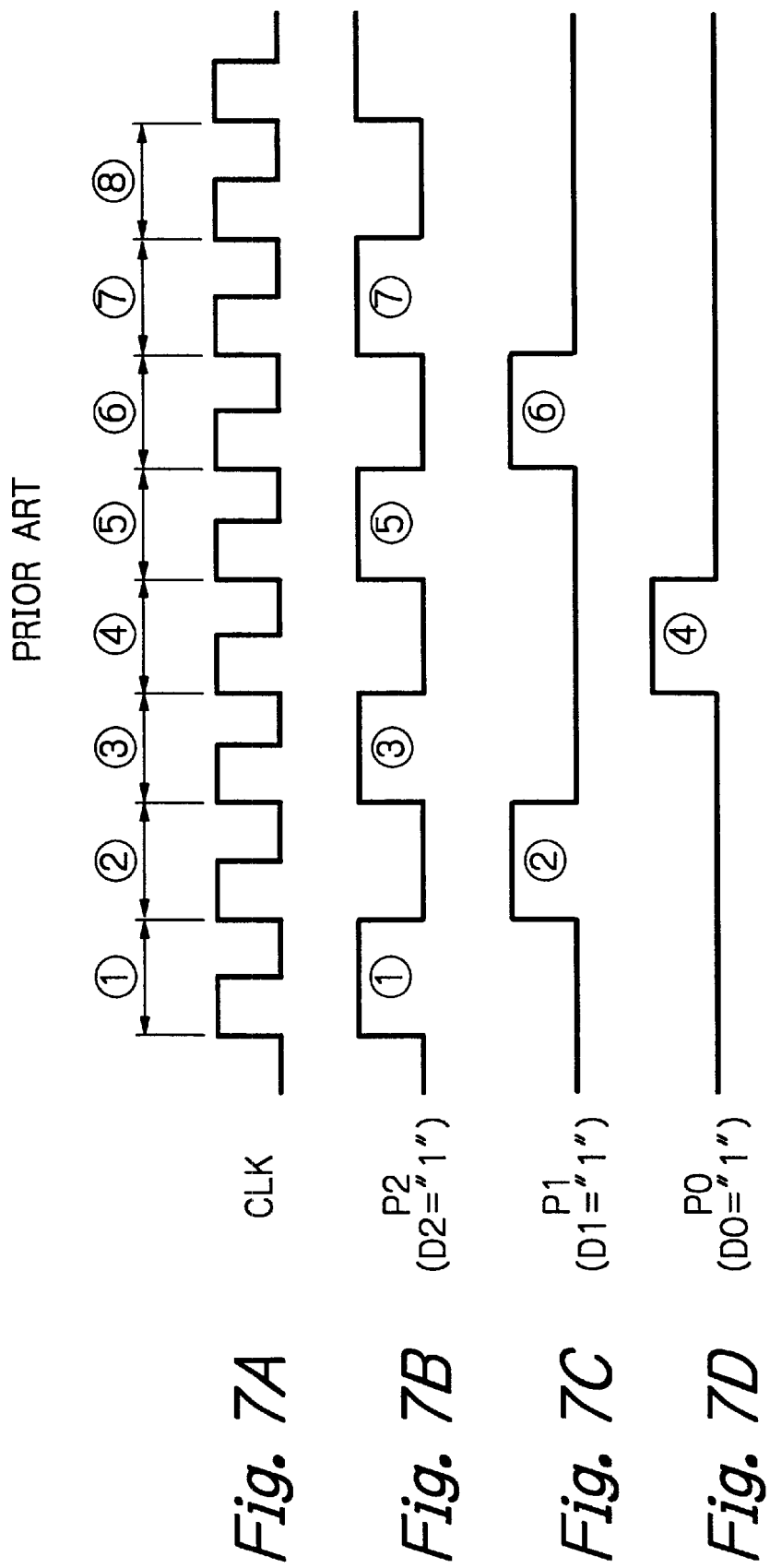

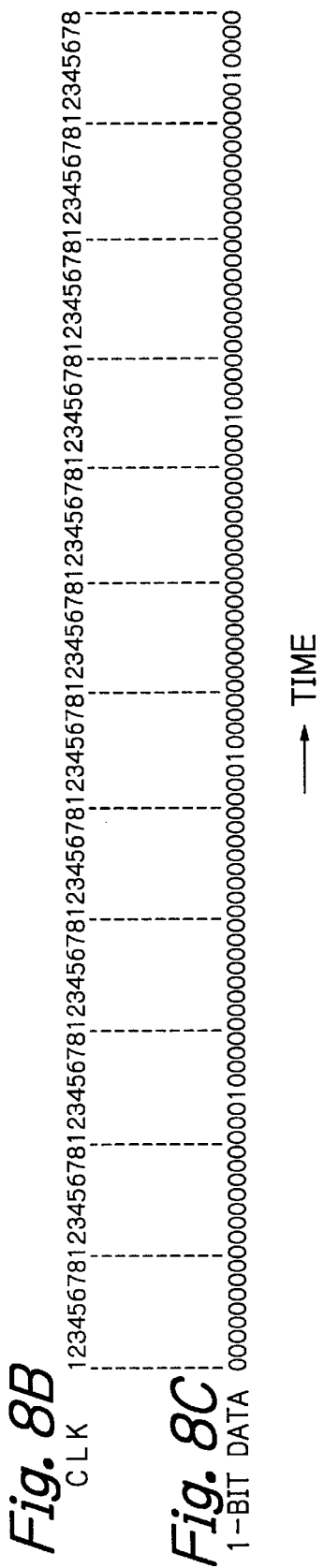
Fig. 8A LOWER-ORDER 3 BITS OF $D_{in}$
Fig. 8B CLK
Fig. 8C 1-BIT DATA
PRIOR ART

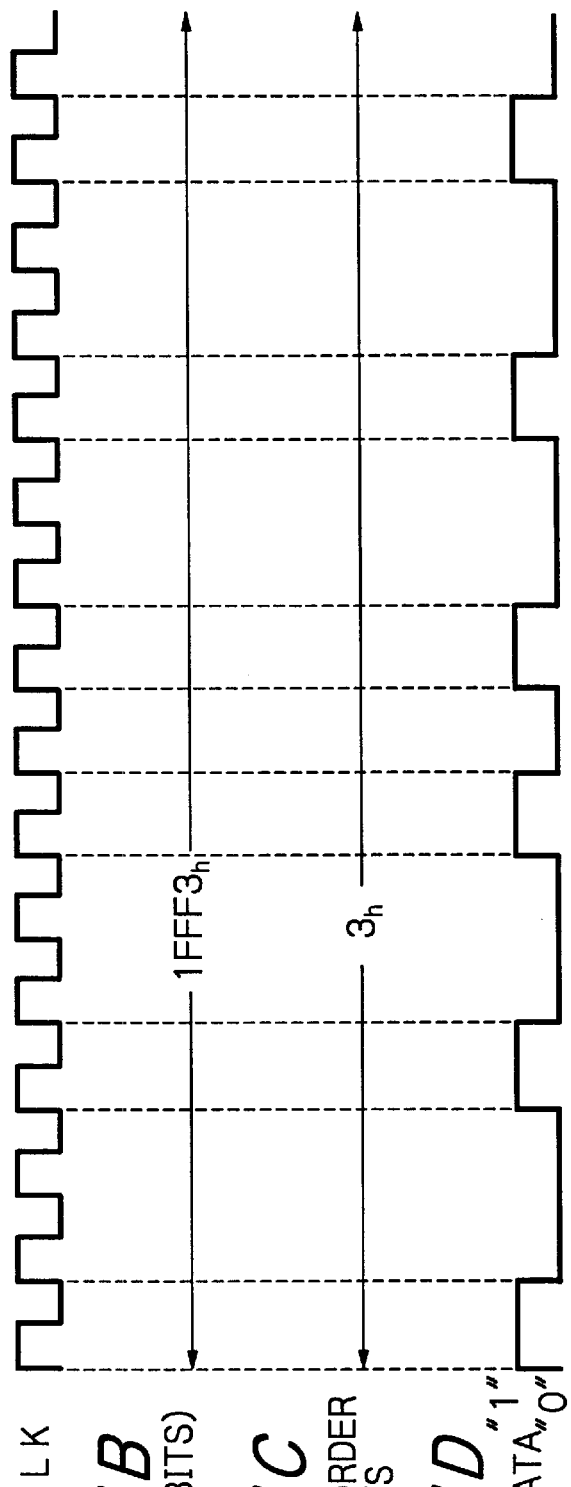

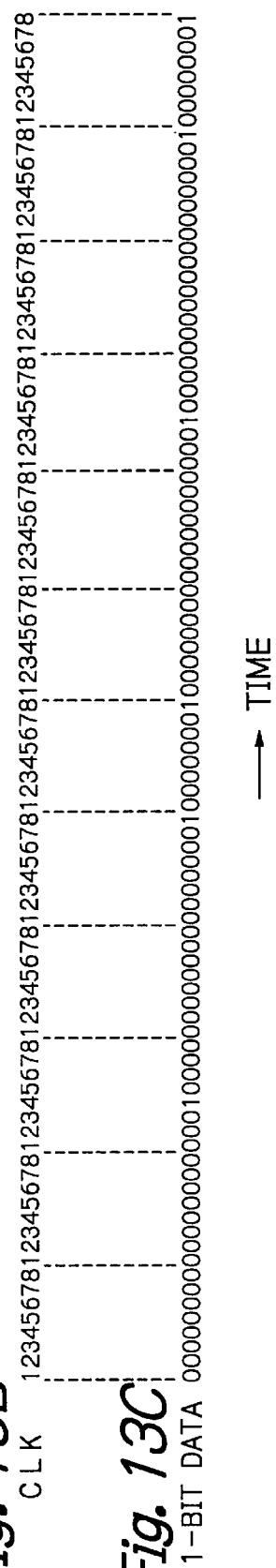

DIGITAL/ANALOG CONVERTER HAVING DELTA-SIGMA TYPE PULSE MODULATION CIRCUIT

BACKGROUND OF THE INVENTION

1. Field of the Invention

The present invention relates to a digital/analog (D/A) converter.

2. Description of the Related Art

In a first prior art D/A converter, resistors are connected in series between a power supply voltage terminal and a ground terminal. Nodes of the resistors are connected via analog switches to an output terminal. That is, one of the analog switches is turned ON in accordance with a decoded value of a digital input data. This will be explained later in detail.

In the above-described first prior art D/A converter, however, the larger the number of bits of the digital input data, the larger the number of ladder resistors connected in series. This reduces the integration. Also, since it is substantially impossible to make the values of a large number of ladder resistors uniform, a high resolution cannot be expected.

In a second prior art D/A converter, an (m+n)-bit digital input data is divided into an upper-order m-bit data and a lower-order n-bit data which are supplied to a main D/A conversion section and a sub D/A conversion section. The analog voltages of the D/A conversion sections are supplied to a weighted adder. Thus, an output voltage corresponding to the digital input can be obtained at an output terminal. This also will be explained later in detail.

In the above-described second prior art D/A converter, since the number of bits of each of the D/A conversion sections is decreased, the total number of ladder resistors can be remarkably decreased as compared with the first prior art D/A converter. This improves the integration. Also, since it is easy to make the values of a smaller number of ladder resistors uniform, a high resolution for each of the D/A conversion sections can be expected.

In tile above-described second prior art D/A converter, however, since the analog voltage is obtained by the addition of two analog voltages, the output voltage fluctuates. Thus, the linear output characteristics are deteriorated.

In a third D/A converter (see: JP-A-9-83368), an (m+n)-bit digital input data is divided into an upper-order m-bit data and a lower-order n-bit data. The lower-order n-bit data is supplied to a pulse modulation circuit, and the upper-order m-bit data is supplied to m-bit adder. The pulse modulation circuit generates a 1-bit data corresponding to the lower-order n-bit data in synchronization with a clock signal. The m-bit adder adds the 1-bit of the pulse modulation circuit to the upper-order m-bit data to generate m-bit data which is subjected to a D/A conversion by a D/A conversion section. Then, the analog output voltage of the D/A conversion section is supplied to a low-pass filter, to remove a high frequency component of the analog output voltage. Thus, an analog output voltage corresponding to the (m+n)-bit input data is obtained. This also will be explained later in detail.

In the above-described third prior art D/A converter, since the total number of ladder resistors is decreased, the integration and the resolution can be improved. Also, since the weighted adder of the second prior art D/A converter is unnecessary, the linear output characteristics can be improved.

In the above-described third prior art D/A converter, however, the location of 1-bit data corresponding to definite lower-order bits is definite within the clock signal. As a result, when a special sequence of the lower-order bits occurs, the accuracy of conversion remarkably deteriorates.

SUMMARY OF THE INVENTION

It is an object of the present invention to provide a D/A converter having an improved conversion accuracy.

According to the present invention, in a digital/analog converter for (m+n)-bit digital input data, a sigma-delta type pulse modulation circuit receives lower-order n bits of the digital input data lo generate 1-bit data corresponding to the lower-order n bits in synchronization with a clock signal. An m-bit adder adds said 1-bit data to upper-order m bits of the digital input data. An m-bit digital/analog conversion section performs a. digital-to-analog conversion upon an output value of the m-bit adder. A low-pass filter removes a high frequency component of an output value of the m-bit digital/analog conversion section to generate an analog data corresponding to the (m+n)-bit digital input data.

BRIEF DESCRIPTION OF THE DRAWINGS

The present invention will be more clearly understood from the description set forth below, as compared with the prior art, with reference to the accompanying drawings, wherein:

FIG. 2 is a table showing relationship between the turned analog switch and the digital input data $D_{in}$ of FIG. 1;

FIGS. 7A, 7B, 7C and 7D are timing diagrams for explaining the operation of the pulse modulation circuit of FIG. 6;

FIGS. 8A, 8B and 8C are timing diagrams for explaining the conversion accuracy of the D/A converter of FIG. 5;

FIGS. 11A, 11B, 11C, 11D, 12A, 12B, 12C and 12D are timing diagrams for explaining the operation of the sigma-delta type pulse modulation circuit of FIG. 10; and FIGS. 13A, 13B and 13C are timing diagrams for explaining the conversion accuracy of the D/A converter of FIG. 9.

DESCRIPTION OF THE PREFERRED EMBODIMENT

Before the description of the preferred embodiment, prior art D/A converters will be explained with reference to FIGS. 1, 2, 3, 4, 5, 6, 7A, 7B, 7C, 7D, 8A, 8B and 8C.

Figure 1:
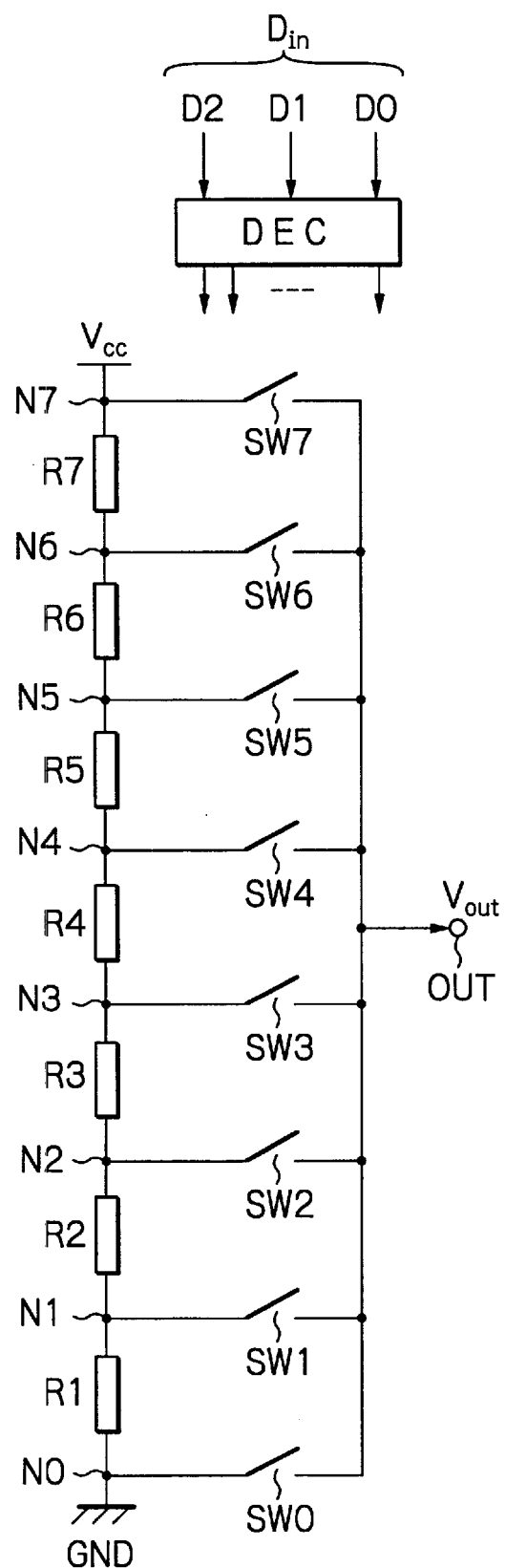
FIG. 1 is a circuit diagram illustrating a first prior art D/A converter.

In FIG. 1, which illustrates, a first prior out D/A converter, digital input data $D_{in}$ formed by three bits D0, D1 and D2 is converted into an analog output voltage $V_{out}$. In this case, $(2^3-1)$ resistors R1, R2, . . . , R7 are connected in series between a power supply voltage terminal $V_{cc}$ and a ground terminal GND. Nodes N0, N1, ..., N7 of the resistors R1, R2, ..., R7 are connected via analog switches SW0, SW2, ..., SW7 to an output terminal OUT.

In FIG. 1, one of the analog switches SW0, SW1, ..., SW7 is turned ON in accordance with a decoded value of the bits D0, D1 and D2 decoded by a decoder DEC. For example, as shown in FIG. 2, is (D2, D1, D0)=(0, 0, 0), the switch SW0 is turned ON, and if (D2, D1, D0)=(0, 0, 1), the switch SW1 is turned ON. Thus, the output voltage $V_{out}$ at the output terminal OUT has eight values in accordance with the analog switches SW0, SW1, ..., SW7.

In the D/A converter of FIG. 1, however, the larger the number of bits of the digital input data $D_{in}$, the larger the number of ladder resistors connected in series. For example, if the number of the digital input data $D_{in}$ is 10, the number of ladder resistors is 1023 (=1024−1). This reduces the integration. Also, since it is substantially impossible to make the values of a large number of ladder resistors uniform, a high resolution cannot be expected.

Figure 3:
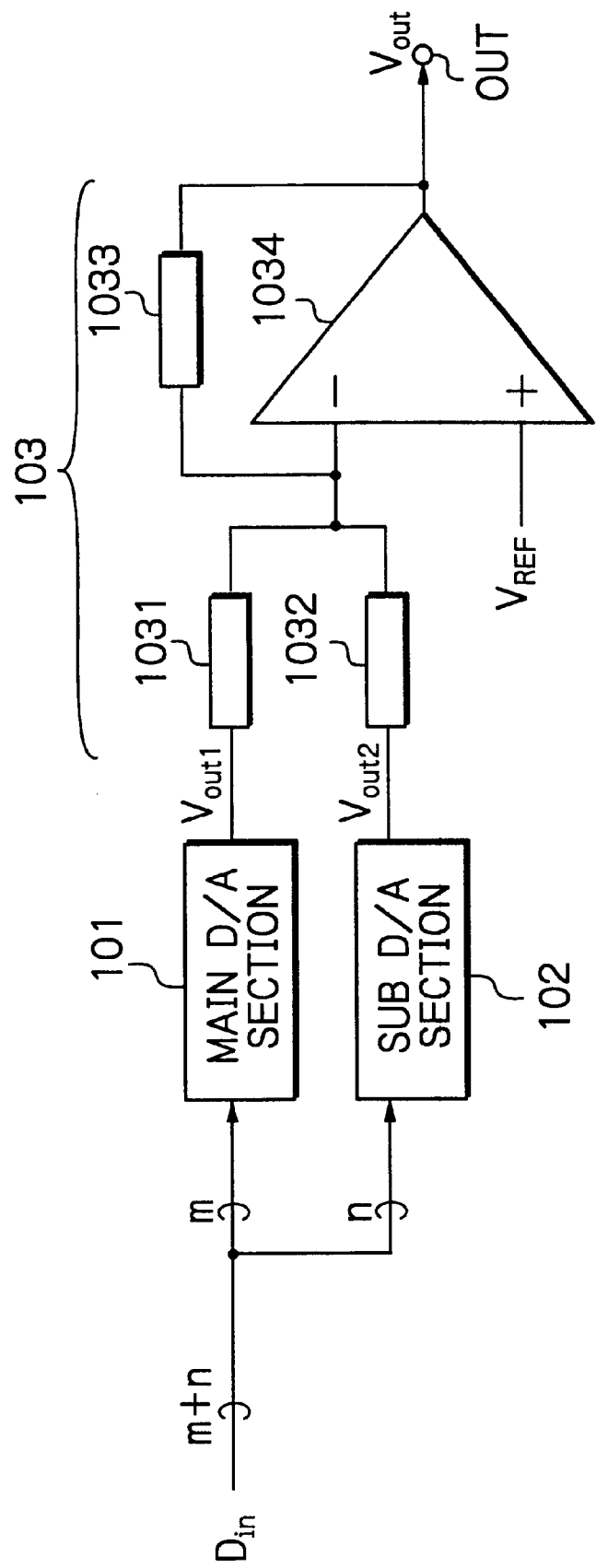
FIG. 3 is a block circuit diagram illustrating a second prior art D/A converter.

In FIG. 3, which illustrates a second prior art D/A converter, an (m+n)-bit digital input data $D_{in}$ is divided into an upper-order m-bit data and a lower-order n-bit data which are supplied to a main D/A conversion section 101 and a sub D/A conversion section 102, respectively, which both have similar constructions to the D/A converter of FIG. 1. The analog voltages $V_{out1}$ and $V_{out2}$ of the D/A conversion sections 101 and 102 are supplied to a weighted adder 103 formed by resistors 1031, 1032 and 1033 and an operational amplifier 1034. Thus, an output voltage $V_{out}$ corresponding to the digital input $D_{in}$ can be obtained at an output terminal OUT.

In the D/A converter of FIG. 3, since the number of bits of each of the D/A conversion sections 101 and 102 is decreased, the total number of ladder resistors can be remarkably decreased as compared with the D/A converter of FIG. 1. For example, if m=n=5, the number of ladder resistors of each of the D/A conversion sections 101 and 102 is 31 (=32−1), and therefore, the total number of ladder resistors is 62. This improves the integration. Also, since it is easy to make the values of a smaller number of ladder resistors uniform, a high resolution for each of the D/A conversion sections 101 and 102 can be expected.

Figure 4:
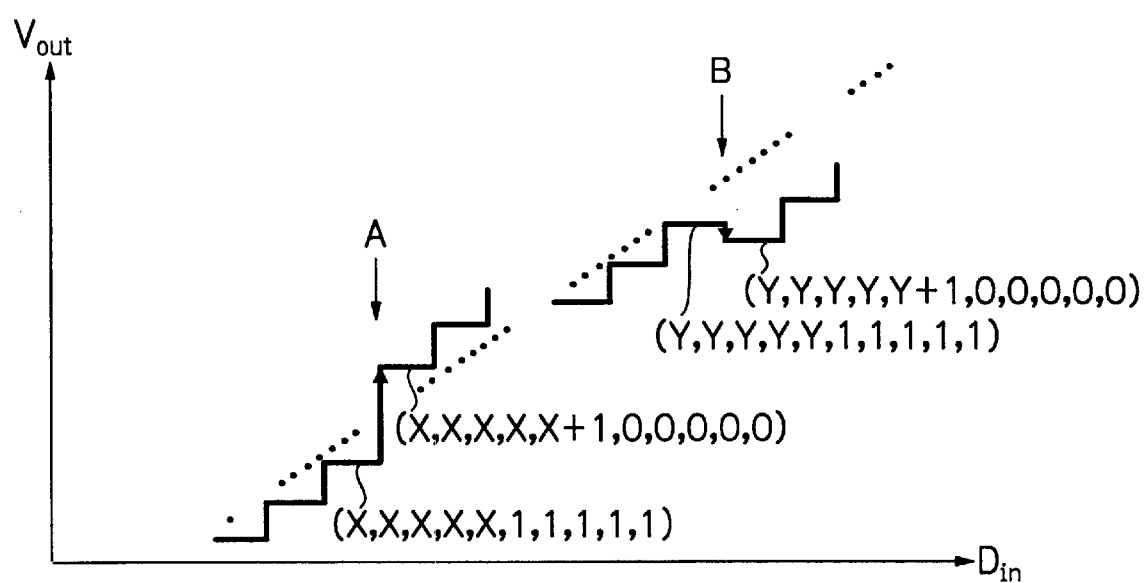
FIG. 4 is a graph showing coutput characteristics of the D/A converter of FIG. 3.

In the D/A converter of FIG. 3, however, since the analog voltage $V_{out}$ is obtained by the addition of the analog voltages $V_{out1}$ and $V_{out2}$, when the lower-order n-bit data is changed from (1, 1, 1, 1, 1) to (0, 0, 0, 0, 0) as shown in FIG. 4 where n is 5, the output voltage $v_{out}$ fluctuates as indicated by A and B in FIG. 4. This fluctuation of the output voltage $V_{out}$ is due to the fluctuation of the values of the resistors 1031, 1032 and 1033, the fluctuations of a zero-scale and full-scale of each of the D/A conversion sections 101 and 102. Thus, the linear output characteristics are deteriorated.

Figure 5:
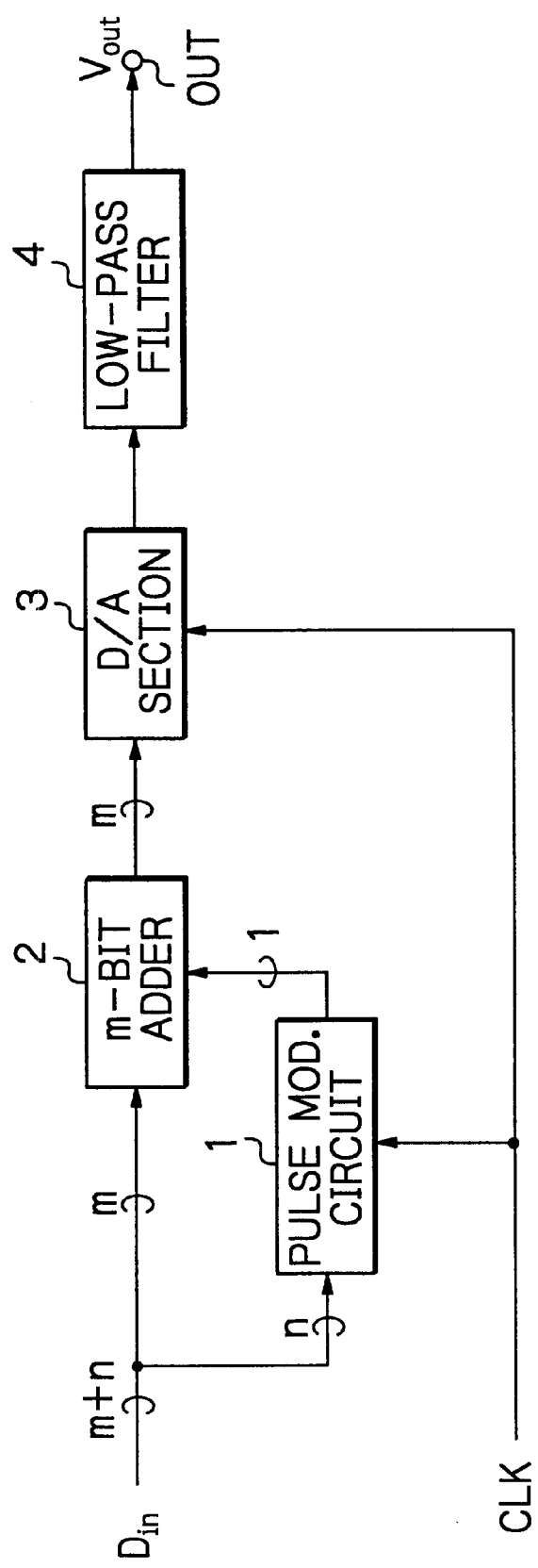
FIG. 5 is a block circuit diagram illustrating a third prior art D/A converter.

In FIG. 5, which illustrates a third D/A converter (see: JP-A-9-83368), an (m+n)-bit digital input data $D_{in}$ is divided into an upper-order m-bit data and a lower-order n-bit data. The lower-order n-bit data is supplied to a pulse modulation circuit 1, and the upper-order m-bit data is supplied to an m-bit adder 2. The pulse modulation circuit 2 generates a 1-bit data corresponding to the lower-order n-bit data in synchronization with a clock signal CLK, which will be explained later in detail.

The m-bit adder 2 adds the 1-bit of the pulse modulation circuit 1 to the upper-order m-bit data to generate m-bit data which is subjected to a D/A conversion by a D/A conversion section 3. Then, the analog output voltage of the D/A conversion section 3 is supplied to a low-pass filter 4, to remove a high frequency component of the analog output voltage. Thus, an analog output voltage $V_{out}$ corresponding to the (m+n)-bit input data $D_{in}$ is obtained at an output terminal OUT.

Note that the clock signal CLK is also supplied to the latch circuit (not shown) of an input stage of the D/A conversion section 3, so that a D/A conversion is carried out at every pulse of the clock signal CLK.

Figure 6:
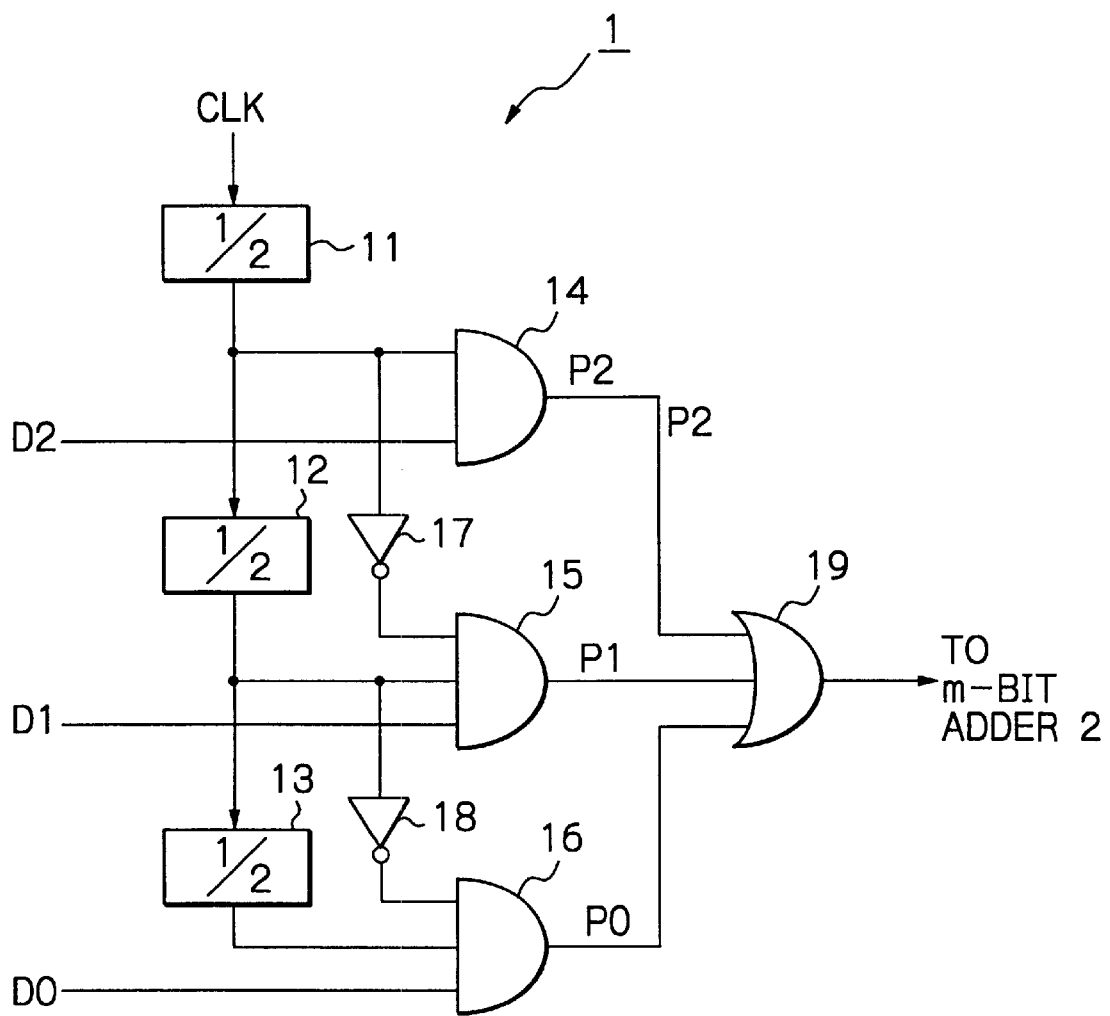
FIG. 6 is a detailed circuit diagram of the pulse modulation circuit of FIG. 5.

In FIG. 6, which is a detailed circuit diagram of the pulse modulation circuit 1 of FIG. 5, the clock signal CLK as shown in FIG. 7A is supplied to ½ frequency dividers (T-type flip-flops) 11, 12 and 13 in series. The output signals of the ½ frequency dividers 11, 12 and 13 are supplied to AND circuits 14, 15 and 16, respectively, which also receives the lower-order three bits D2, D1 ad D0, respectively. Here, assume that n is 3. Also, the output signal of the ½ frequency divider 11 is supplied via an inverter 17 to the AND circuit 15, and the output signal of the ½ frequency divider 12 is supplied via an inverter 18 to the AND circuit 16.

If D2="1", the output signal P2 of the AND circuit 14 is as shown in FIG. 7B. Also, if D1="1", the output signal P1 of the AND circuit 15 is as shown in FIG. 7C. Further, if D0="1", the output signal PO of the AND circuit 16 is as shown in FIG. 7D.

The output signals P2, P1 and P0 of the AND circuits 14, 15 and 16 are supplied via an OR circuit 19 as 1-bit data to the m-bit adder 2.

For example, if the lower-order input 3 bits D2, D1 and D0 are changed as shown in FIG. 8A, the 1-bit data is changed as shown in FIG. 8C in synchronization with the clock signal CLK as shown in FIG. 8B.

In the D/A converter, of FIG. 5, since the total number of ladder resistors is decreased, the integration and the resolution can be improved. Also, since the weighted adder 103 of FIG. 3 is unnecessary, the linear output characteristics can be improved.

In the D/A converter of FIG. 5, however, the location of 1-bit data corresponding to definite lower-order bits is definite within the clock signal CLK. For example, if (D2, D1, D0)=(0, 0, 1), the location of 1-bit data is at the fourth period ④ of the clock signal CLK (see: FIG. 8C). As a result, when a special sequence of the lower-order bits occurs, the accuracy of conversion remarkably deteriorates. For example, if the lower-order three bits are changed from (000) to (001) and vice versa as shown in FIG. 8A, the ratio of 1-bit data "1" is 1/24 pulses of the clock signal CLK, which is greatly deviated from an ideal ratio value, 1/16 of 1-bit data "1".

Figure 9:
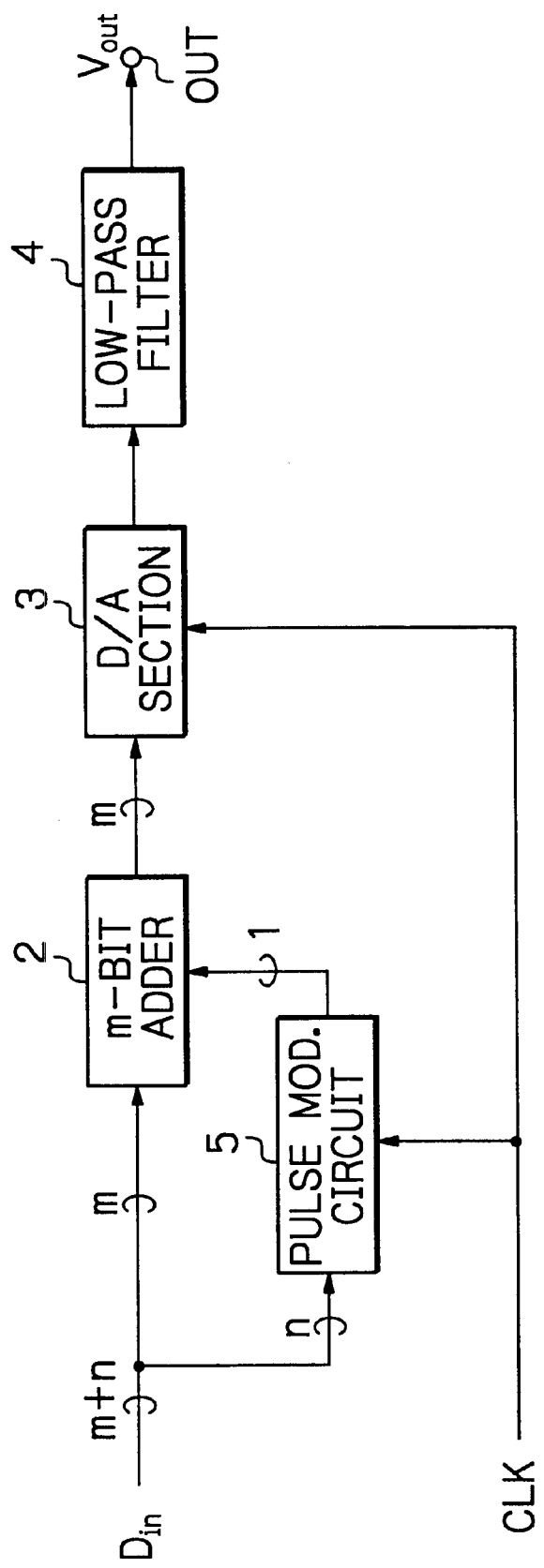
FIG. 9 is a block circuit diagram illustrating an embodiment of the D/A converter according to the present invention.

In FIG. 9, which illustrates an embodiment of the present invention, a delta-sigma type pulse modulation circuit 5 is provided instead of the pulse modulation circuit 1 of FIG. 5.

Figure 10:
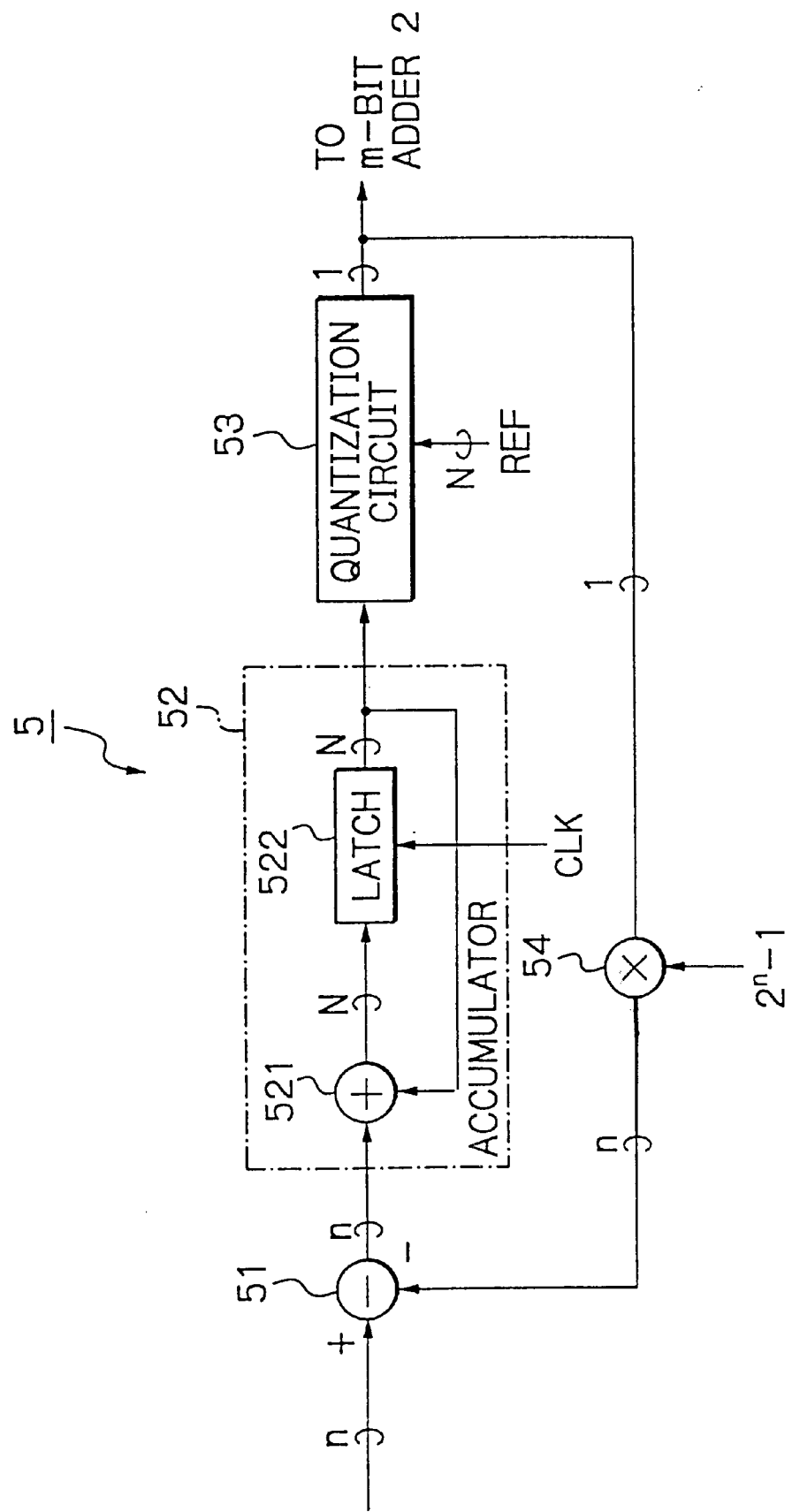
FIG. 10 is a detailed circuit diagram of the sigma-delta type pulse modulation circuit of FIG. 9.

As illustrated in FIG. 10, the delta-sigma type pulse modulation circuit 5 is constructed by an n-bit subtracter 51, an accumulator 52 for accumulating the output value of the subtracter 51, a quantization circuit 53 for comparing the value of the accumulator 52 with a reference value REF to generate 1-bit data, and a signal transformer (multiplexer) 54 for transforming the 1-bit data from the quantization circuit 53 into an n-bit data.

In more detail, the accumulator 52 is constructed by an N-bit adder 521 and an N-bit latch circuit 522 where N is larger than n. That is, the latch circuit 522 latches the output value of the adder 521 in synchronization with the clock signal CLK, and the adder 521 adds the output value of the latch circuit 522 to the output value of the subtracter 51. Thus, the output value of the subtracted 51 is accumulated in the accumulator 52.

The reference value REF of the quantizationr circuit 53 is set to be a half value of the maximum value of the accumulator 52, for example.

The signal transformer 54 multiplies the 1-bit data by the maximum value of the lower-order bits, i.e., $2^n-1$. If n is 3, $2^n-1=7$. In this case, when the 1-bit data is "0", the output signal value of the signal transformer 54 is 0, while when the 1-bit data is "1", the output signal value of the signal transformer 54 is 7.

In the delta-sigma type pulse modulation circuit 5 of FIG. 10, the 1-bit data of the quantization circuit 53 is "0", the lower-order 3-bit data is supplied without the modification by the subtracter 51 to the accumulator 52. As a result, the value of the accumulator 52 accumulated in the latch circuit 522 is increasing.

On the other hand, in the delta-sigma type pulse modulation circuit 5 of FIG. 10, if the 1-bit data of the quantization circuit 53 is "1", the output value of the subtracter 51 is negative or zero. As a result, the value of the accumulator 52 accumulated in the latch circuit 522 is decreasing or maintaining the current value.

That is when the lower-order 3-bit input data is smaller than 7, since the output value of the signal transformer 54 is 7, the output value of the subtracter 51 is negative, thus decreasing the accumulated value of the accumulator 52. For example, when the lower-order 3-bit input data is 3, the value of the accumulator 52 is being increased by the 1-bit data "0", so that the quantization circuit 53 generates the 1-bit data "1" every time the value of the accumulator 52 reaches the reference value REF. When, the 1-bit data "1" is generated, the value of the accumulator 52 is decreased to occasionally stop the generation of the 1-bit data "1". Thus, as shown in FIGS. 11A through 11D, 1-bit data "1" is intermittently generated in accordance with the lower-order input 3-bits (=$3_h$).

Contrary to this, when the lower-order 3-bit input data is 7, since the output value of the signal transformer 54 is 7, the output value of the substructure 51 is zero, thus maintaining the accumulated value of the accumulator 52. Thus, as shown in FIGS. 12A through 12D, 1-bit data "1" is continuously generated in accordance with the lower-order input 3-bits (=$7_h$).

For example, if the lower-order input 3 bits are changed as shown in FIG. 13A, the 1-bit data is changed as shown in FIG. 13C in synchronization with the clock signal CLK as shown in FIG. 13B. That is, the location of 1-bit data corresponding to definite lower-order bits is not definite within the clock signal CLK. As a result, even when a special sequence of the lower-order bits occurs, the accuracy of conversion is remarkably improved. For example, if the lower-order three bits are changed from (000) to (001) and vice versa as shown in FIG. 13A, the ratio of 1-bit data "1" is 1/16 pulses of the clock signal CLK, which is the same as an ideal ratio value 1/16 of 1-bit data "1".

As explained hereinabove, according to the present invention, since a sigma-delta type pulse modulation circuit is used, the accuracy of D/A conversion can be remarkably improved.

What is claimed is:

1. A digital/analog converter for (m+n)-bit digital input data comprising:

a sigma-delta type pulse modulation circuit for receiving lower-order n bits of said digital input data to generate 1-bit data corresponding to said lower-order n bits in synchronization with a clock signal, said sigma-delta type pulse modulation circuit including a feedback loop with a signal transformer that transforms said 1-bit data into n-bit digital data which is combined with subsequent input data received by said sigma-delta type pulse modulation circuit;

an m-bit adder, connected to said sigma-delta type pulse modulation circuit, for adding said 1-bit data to upper-order m bits of said digital input data;

an m-bit digital/analog conversion section, connected to said m-bit adder, for performing a digital-to-analog conversion upon an output value of said m-bit adder; and a low-pass filter, connected to said m-bit digital/analog conversion section, for removing a high frequency component of an output value of said m-bit digital/analog conversion section to generate an analog data corresponding to said (m+n)-bit digital input data.

2. The digital/analog converter as set forth in claim 1, wherein said sigma-delta type pulse modulation circuit comprises:

a subtracter for subtracting an n-bit digital data from said lower-order n bits;

a accumulator, connected to said subtracter, for accumulating an output value of said subtracter;

an quantization circuit, connected to said accumulator, for comparing an output value of said accumulator with a reference value to generate said 1-bit data; and said signal transformer, connected between said quantization circuit and said subtracter.

3. The digital/analog converter as set forth in claim 2, wherein said accumulator comprises:

an adder connected to said subtracter;

a latch circuit, connected to said adder, for storing an output value of said adder in synchronization with said clock signal, said adder adding the output value of said latch circuit to the output value of said subtracter.

4. The digital/analog converter as set forth in claim 2, wherein said signal transformer comprises a multiplexer for multiplexing said 1-bit data by a maximum value of said lower-order n bits.

* * * * *